US007864236B2

(12) United States Patent
Sekine

(10) Patent No.: US 7,864,236 B2
(45) Date of Patent: Jan. 4, 2011

(54) CMOS IMAGE SENSOR

(75) Inventor: Hirokazu Sekine, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 966 days.

(21) Appl. No.: 11/196,394

(22) Filed: Aug. 4, 2005

(65) Prior Publication Data

US 2006/0028569 A1 Feb. 9, 2006

(30) Foreign Application Priority Data

Aug. 5, 2004 (JP) ............................. 2004-229187

(51) Int. Cl.
*H04N 3/14* (2006.01)
*H04N 5/335* (2006.01)
(52) U.S. Cl. .................. 348/294; 348/298; 348/302; 348/308; 348/312
(58) Field of Classification Search ................ 348/294, 348/298, 302, 311, 312; 250/208.1; 257/290–292
See application file for complete search history.

(56) References Cited

U.S. PATENT DOCUMENTS

| | | | | |
|---|---|---|---|---|
| 5,955,753 | A | * | 9/1999 | Takahashi ............... 257/292 |
| 6,933,976 | B1 | * | 8/2005 | Suzuki .................... 348/315 |
| 7,436,010 | B2 | * | 10/2008 | Mori et al. ............... 257/292 |
| 2004/0065910 | A1 | * | 4/2004 | Yoshiaki et al. ........... 257/291 |

FOREIGN PATENT DOCUMENTS

| | | |
|---|---|---|
| JP | 2001-24948 | 1/2001 |
| JP | 2001-298177 | 10/2001 |
| JP | 2004-153253 | 5/2004 |

* cited by examiner

*Primary Examiner*—Yogesh K Aggarwal
(74) *Attorney, Agent, or Firm*—Oblon, Spivak, McClelland, Maier & Neustadt, L.L.P.

(57) ABSTRACT

The CMOS image sensor includes a plurality of photoelectric conversion elements arranged in a matrix having a plurality of rows and columns. A plurality of floating junctions are provided, each of which is arranged between one of a plurality of pairs of the photoelectric conversion elements arranged in adjacent two rows and is connected to one of the pairs of the photoelectric conversion elements, so that output signals of the pair of the photoelectric conversion elements may be transferred. Output circuits are connected to a plurality of the floating junctions arranged in the column for reading in common the output signals of the photoelectric conversion elements transferred to these flowing junctions. Output signal lines are provided for each column so as to supply output signals of the output circuits. The output circuits are arranged between the pairs of photoelectric conversion elements adjacently arranged in the row.

A CMOS image sensor has a plurality of pixels PD arranged two-dimensionally at predetermined pitches in the vertical direction and horizontal direction and a plurality of output circuits OUT for reading output signals from the pixels PD and the output circuits OUT are arranged between pairs of PD pixels arranged in the row (vertical) direction. The output circuits OUT read in common accumulated signals of pixels composed of the plurality of pixels PD and output them to signal output lines. By use of such a constitution, integration of the pixels arranged in a two-dimensional matrix in the horizontal direction can be improved.

20 Claims, 7 Drawing Sheets

CMOS IMAGE SENSOR

CROSS-REFERENCE TO RELATED APPLICATIONS

This application is based upon and claims the benefit of priority from the prior Japanese Patent Application No. 2004-229187, filed on Aug. 5, 2004, the entire contents of which are incorporated herein by reference.

BACKGROUND OF THE INVENTION

The present invention relates to, for example, a CMOS image sensor suitable for a solid image pickup device such as a digital camera.

A device having a plurality of photodiodes (hereinafter, abbreviated to PDs) arranged in a matrix is known as a conventional CMOS image sensor. Each of these PDs constitutes one pixel respectively. In the CMOS image sensor, output circuits are arranged in a matrix to fill up gaps between the PDs. The matrix of the output circuits is a two-dimensional matrix having repetitive pitches in row and column direction, which are n and m times as long as those in the matrix of the PDs. Each of the output circuits commonly reads two PDs arranged in the row.

Furthermore, a CMOS image sensor having output circuits, each of which is so designed as to commonly read four PDs arranged in the column to increase the integration density (refer to U.S. Pat. No. 6,091,449).

Meanwhile, in such a conventional CMOS image sensor, high integration circuit is obtained because a signal of two or four PDs arranged in the column is read by a common output circuit. The high integration is effectively realized in the column direction, that is, in the vertical direction of the screen. However, the high integration is difficult to realize in the horizontal direction, because the output circuits are arranged in the row direction at each column, where pixel signal cannot be detected. Particularly, when the CMOS image sensor is applied to a digital camera, it is necessary to make the pixel pitches equal to each other both in the horizontal and vertical directions. Thus, the high circuit integration only in the vertical direction is less advantageous in the layout of the integrated circuit.

Further, in the conventional sensor, the pixels and output circuits are horizontally arranged side by side, so that an opening for each pixel is vertically long, that is, it is rectangle having a vertical side longer than a horizontal side. Even in CCD area sensors, the opening for each pixel is also vertically long because there is a CCD register arranged side by side with each pixel in the horizontal direction. On the other hand, the aspect ratio of the optical system of the camera general used is 3:4, which is rectangle having a horizontal side longer than a vertical side. Therefore, taking a light entering through a lens to the photosensitive surface of the sensor into consideration, in particular, the lights entering into the pixels located at peripheral area of the photosensitive surface, the light enters more slantwise to the pixel located in the horizontally end portion than to the pixel located in the vertically end portion. Therefore, an output level obtained from the pixels located in the peripheral area is generally lower than that obtained from the pixels located in the central area, which is so-called shading. Vertically long openings for pixels are more easily affected by the shading than horizontally long openings.

Furthermore, in the conventional CMOS image sensor, a reading gate and a floating junction shared by the upper and lower pixels are installed between the pixels in the vertical direction. In application to a digital camera or a camera of a portable telephone, it is necessary to arrange a plurality of pixels in a square matrix. In addition, the openings for pixels are desirable to be arranged at an equal interval. Therefore, the intervals between the pixels in the vertical direction where the reading gate is not installed must be equal to the intervals between the pixels where the reading gate is installed and thus the space between the pixels in the vertical direction could not be used effectively.

SUMMARY OF THE INVENTION

The present invention was made taking the aforementioned problems into consideration and to provide a CMOS image sensor realizing high circuit integration in both horizontal and vertical directions.

The CMOS image sensor according to an embodiment of the present invention includes a plurality of photoelectric conversion elements arranged in a matrix having a plurality of rows and columns, a plurality of floating junctions each of which is arranged between one of a plurality of pairs of the photoelectric conversion elements arranged in adjacent two rows and is connected to one of the pairs of the photoelectric conversion elements, so that output signals of the pair of the photoelectric conversion elements may be transferred, output circuits connected to a plurality of the floating junctions arranged in the column among the plurality of floating junctions for reading in common the output signals of the photoelectric conversion elements transferred to these flowing junctions, and output signal lines provided for each column so as to supply output signals of the output circuits, wherein the output circuits are arranged between the pairs of photoelectric conversion elements adjacently arranged in the row.

BRIEF DESCRIPTION OF THE DRAWINGS

FIG. 6 is a diagram showing isolation areas between the photo diodes, wherein

DETAILED DESCRIPTION OF THE INVENTION

Figure 1:
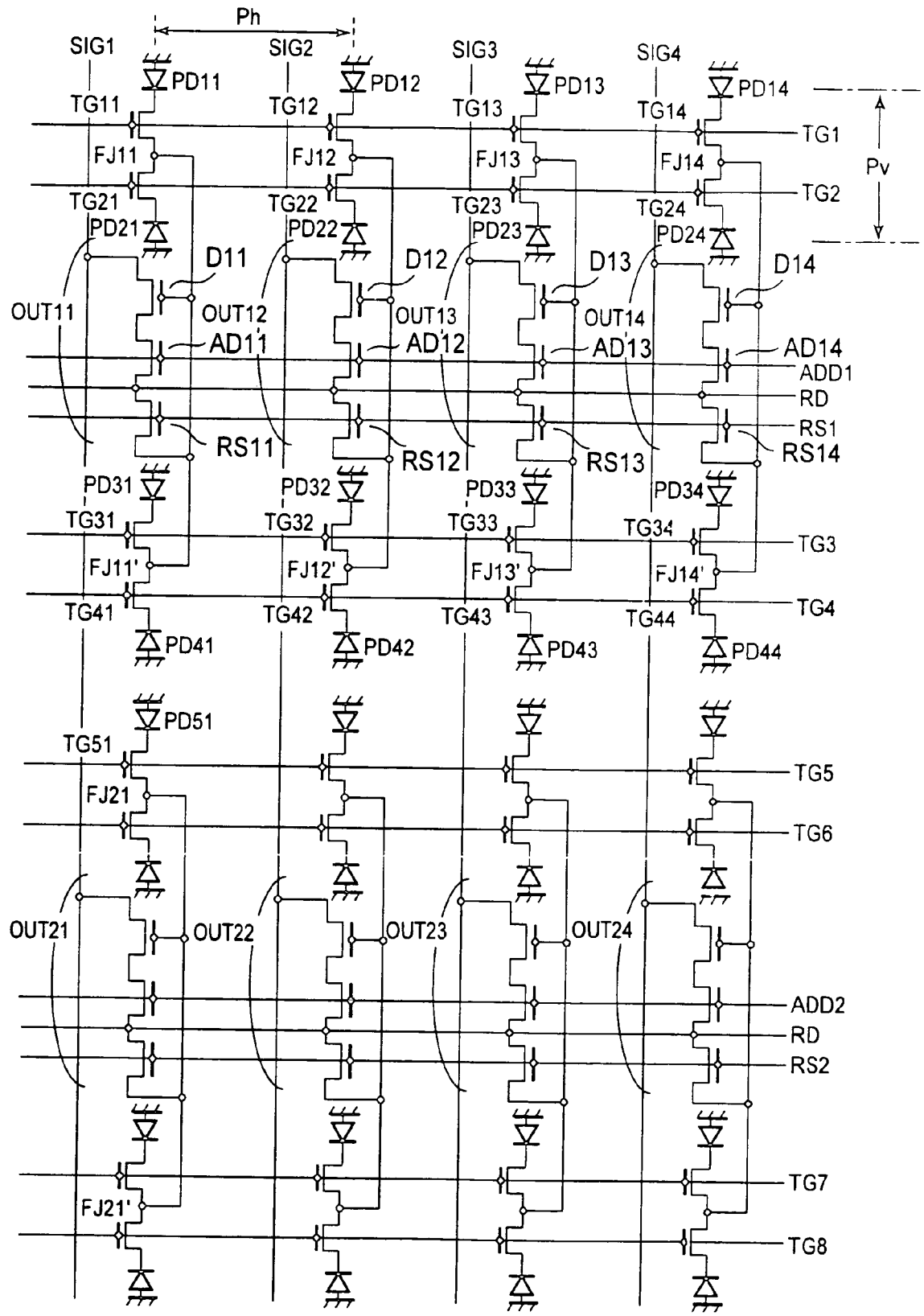
FIG. 1 is a circuit block diagram for showing an embodiment of the present invention.

Hereinafter, an embodiment of the CMOS image sensor according to the present invention will be explained with reference to the accompanying drawings. FIG. 1 is a circuit block diagram for showing an image sensor according to an embodiment of the present invention. The image sensor shown is a 4-pixel-1 cell type sensor. As shown in the drawing, the image sensor is provided with a plurality of photo diodes PD11, PD12, PD13, PD14, PD21, PD22, PD23, and PD24 arranged in a two-dimensional matrix at predetermined repetitive average pitches of Ph and Pv in a row direction (horizontal direction) and in a column direction (vertical direction) These photo diodes are one of the examples of the photoelectric conversion elements for converting light to an electric signal. As another example of the photoelectric conversion element, there is a MOS capacitor having a transparent electrode as a gate instead of a photo diode. Therefore, a photo diode or other photoelectric conversion elements can be used for the photoelectric conversion element of the present invention. The photo diodes form a plurality of pixels of the image sensor respectively. Among the plurality of photo diodes arranged in the two-dimensional matrix, a plurality of output circuits OUT11 to OUT14, OUT21 to OUT24 are arranged in gaps between a pair of pixels arranged in the column (vertical) direction. These output circuits are arranged in a two-dimensional matrix similarly to the photo diodes, the horizontal pitch of which are the same as the pitch Ph of the photo diodes, though the vertical pitch of which are are 4 times of the pitch Pv of the photo diodes in the vertical direction, that is, 4Pv. The output circuits thus arranged read signal charge stored in the four photo diodes successively arranged in the same column.

The construction of one cell shown in FIG. 1 will be explained in more detail. The output circuit OUT11 reads successively the stored signals of the four diodes PD11, PD21, PD31, and PD41 arranged in the same column as explained later. These photo diodes are connected to reading gates TG11, TG21, TG31, and TG41 arranged in the neighborhood of them. The reading gates TG11, TG21, TG31, and TG41 are composed of a MOS transistor and the gate electrodes thereof are connected to gate control lines TG1, TG2, TG3, and TG4 connected in the row direction.

Namely, the reading gate TG11 is connected to the adjacent photo diode PD11. Similarly, the reading gate TG21 is connected to the adjacent photodiode PD21. Between the reading gates TG11 and TG21, a floating junction FJ11 is formed adjacent to them. The reading gates TG11 and TG21 are opened to transfer the output signal charge accumulated in the photo diode PD11 or PD21 to the floating junction FJ11, when a transfer pulse is applied to gate control lines TG1 and TG2.

Similarly, the reading gate TG31 is connected to the adjacent photo diode PD31 and the reading gate TG41 is connected to the adjacent photo diode PD41. Between the reading gates TG31 and TG31, a floating junction FJ11' is formed adjacent to them. The reading gates TG31 and TG41 are opened and transfer the output signal charge accumulated in the photo diode PD31 or PD41 to the floating junction FJ11', when a transfer pulse is applied to gate control lines TG3 and TG4. The floating junctions FJ11 and FJ11' are connected to each other by a floating junction FJL.

The output circuit OUT11 is composed of a drive transistor D11, an address transistor AD11, and a reset transistor RS11. The floating junction FJ11 and the floating junction FJ11' are connected to the gate electrode of the drive transistor D11 included in the output circuit OUT1 and the source electrode of the reset transistor RS11 via the floating junction FJL. Further, the source electrode of the drive transistor D11 included in the output circuit OUT11 is connected to an output signal line SIG1 extending in the column direction. Furthermore, the drain electrode of the reset transistor RS11 included in the output circuit OUT11 is connected to the drain electrode of the address transistor AD11 and also connected to a reset drain voltage line RD extending in the column direction. The gate electrode of the reset transistor is connected to a reset line RS1 extending in the row direction.

Finally, the source electrode of the address transistor AD11 included in the output circuit OUT11 is connected to the drain electrode of the drive-transistor D11 and the gate electrode thereof is connected to an address line ADD1 extending in the row direction.

The operation of the CMOS image sensor according to the aforementioned embodiment of the present invention is explained below. The explanation will be made on how to read the photo diodes PD31, PD32, PD33, and PD34 arranged in one horizontal line when the gate control line TG3 is turned on as an example. The signal charge stored in the photo diodes PD31, PD32, PD33, and PD34 is transferred to FJ11', FJ12', FJ13', and FJ14' when TG3 is turned on. Before transferring, the floating junctions FJ11', FJ12', FJ13', and FJ14' are set to the RS drain voltage by applying an RS pulse to the reset line RS1 so as to turn the reset transistors RS11, RS22, RS13, and RS14 into an on state. Thereafter, the reset line RS1 is turned off and the floating junctions FJ11', FJ12', FJ13', and FJ14' are kept in a floating state.

The signal charge changes the potential of the floating junctions FJ11', FJ12', FJ13', and FJ14' to modulate the potential of the gate electrodes of the drive transistors D11, D22, and D13, which are connected to the junctions FJ11', FJ12', FJ13', and FJ14' respectively and turns on the drive transistors. To operate the output circuits OUT11, OUT22, OUT13, and OUT14, an address pulse is applied to the address line ADD1 to turn the address transistors AD11, AD22, AD13, and AD14 on. As a result, a reading output signal of the photodiodes PD31, PD32, PD33, - - - is output via the output signal lines SIG1, SIG2, SIG3, and SIG4.

In the embodiment described, the common output circuit, for example, OUT1 is arranged in the area between the pixel pairs arranged in the vertical direction, for example, the photo diode pixel pair PD11 and PD21 and the photo diode pixel pair PD31 and PD41. Thus high integration in the horizontal direction can be realized.

Further explanation will be made about the reading of the photo diodes PD11 to PD14 on a horizontal line, when the gate control line TG1 is turned on, for another example. In advance of transferring, the floating junctions FJ11 to FJ14 are reset to the RS drain voltage. Namely, the RS pulse is applied to the RS transistors RS11 to RS14 via the reset line RS1 to turn them on, thus the floating junctions FJ11 to FJ14 are connected to the drain voltage line RD and are reset to the RS drain voltage. Next, the signal charge to FJ11 to FJ14, it is necessary to turn off the RS transistors RS11 to RS14 and put FJ11 to FJ14 into the floating state in advance of the transferring. The signal charge changes the potential of FJ11 to FJ14 and modulates the potential of the drive transistor gates D11, D12, D13, and D14 connected to them respectively. To operate the output circuits OUT11, OUT12, OUT13, and OUT14, an address pulse is applied to the address line ADD1 so that the address transistors AD11, AD12, AD13, and AD14 may be turned on. Signals are output from the signal lines SIG1, SIG2, SIG3, and SIG4.

Figure 2:
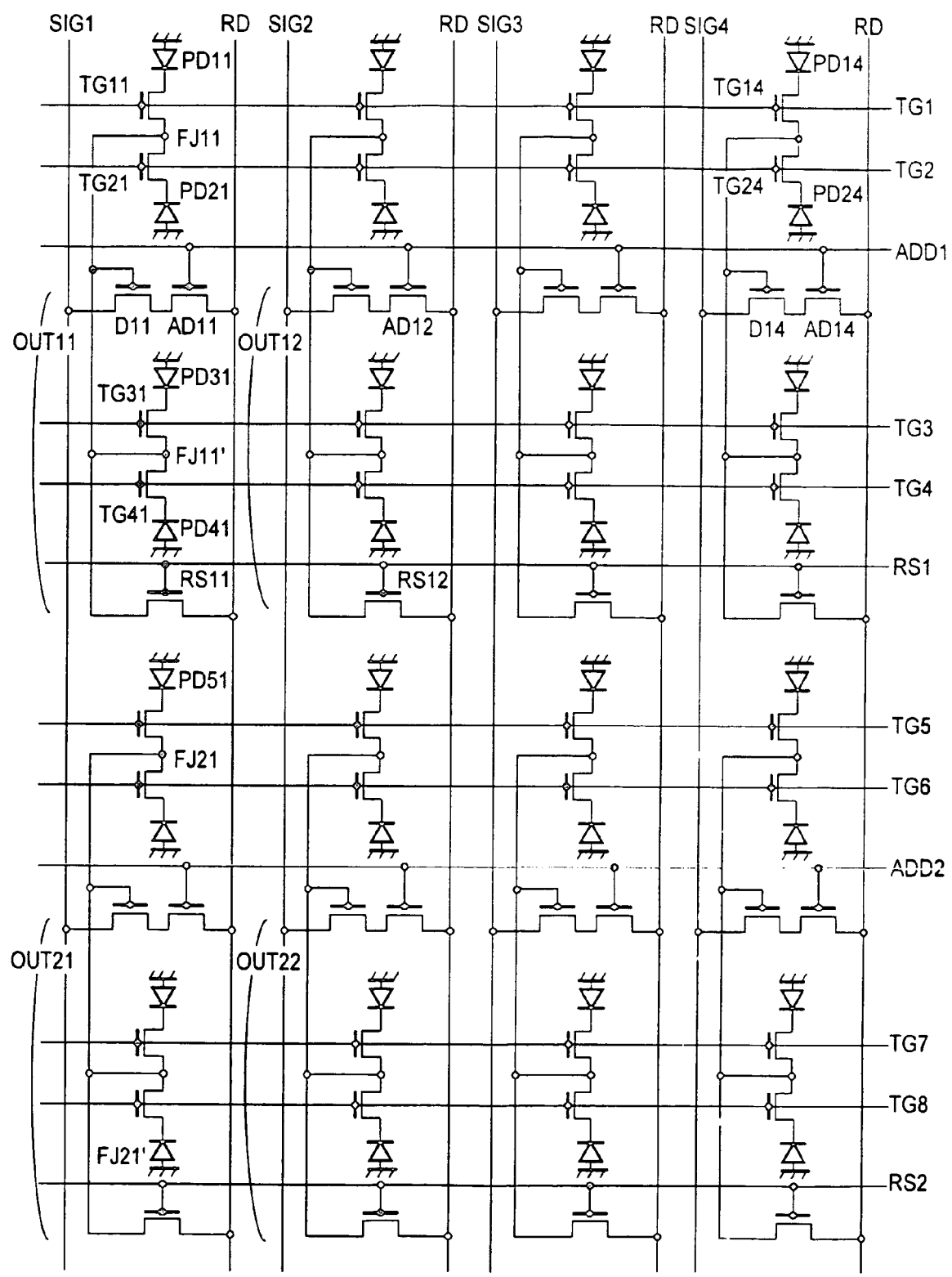
FIG. 2 is a circuit block diagram for showing another embodiment of the present invention.

Another embodiment of the present invention will be explained by referring to FIG. 2. To the same components as those shown in FIG. 1, the same numerals are assigned in FIG. 2. In FIG. 2, the photo diodes PD11, PD21, PD31, and PD41 corresponding to the four pixels arranged in the vertical direction belong to one output circuit, for example, OUT11. A pair of reading gates TG11 and TG21 is arranged between PD11 and PD21, forming a pair of adjacent pixels, wherein the reading gates TG11 and TG21 are connected to the photo diodes PD11 and PD21 respectively. Another pair of reading gates TG31 and TG41 is arranged between PD31 and PD41, forming another pair of adjacent pixels, wherein the reading gates TG31 and TG41 are connected to the respective photo diodes PD31 and PD41. A floating junction FJ11 is arranged between TG11 and TG21, and is connected to TG11 and TG21 in series. Another floating junction FJ11' is arranged between TG31 and TG41, and is connected to TG31 and TG41 in series.

Next, the drive transistor gate D11 and address transistor AD11, forming the output circuit OUT11, are arranged between the photo diodes PD21 and PD31 which are a pair of adjacent pixels in the column (vertical) direction. Further, the RS transistor RS11 forming the output circuit OUT11 is arranged between the photo diodes PD41 and PD51 which are a pair of adjacent pixels in the column (vertical) direction.

This configuration is common to the other output circuits OUT12, OUT13, and OUT14.

As mentioned above, in this embodiment, the drive transistor gate D11 and address transistor AD11 forming the output circuit and the RS transistor RS11 are arranged separately in two different rows of the pixel arrangement in a two-dimensional matrix. Namely, the drive transistors forming the output circuit are arranged, among the pixel arrangement in the two-dimensional matrix, in two rows different from the rows where the reading gate pair TG11 and TG21 or the reading gate pair TG31 and TG41 are arranged. Therefore, in this embodiment, the reading gate pair and the drive transistors forming the output circuit are alternately arranged in the rows of the two-dimensional matrix of the pixel arrangement.

Figure 3:
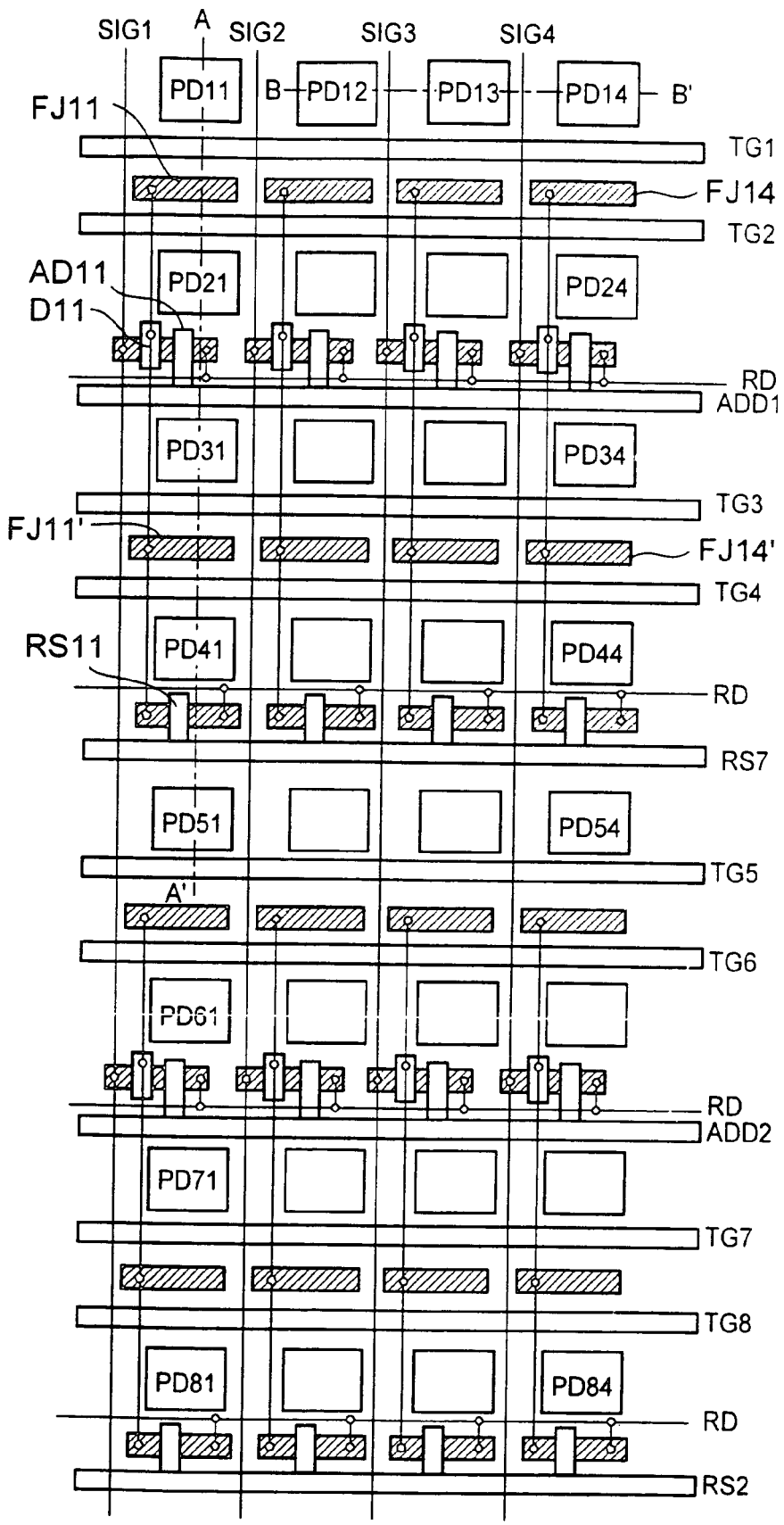
FIG. 3 is a diagram for showing an integrated circuit pattern when the circuit shown in FIG. 2 is formed in an integrated circuit.

FIG. 3 is a plan view showing the circuit arrangement when the CMOS image sensor shown in FIG. 2 is formed in an integrated circuit. In the drawing, the same numerals are assigned to the parts corresponding to those shown in FIG. 2.

As shown in the drawing, gate control lines TG1 and TG2 are provided between the first photo diode row of PD11 to PD14 and the second photo diode row of PD21 to PD24 in parallel with the rows among a plurality of photo diodes arranged in a two-dimensional matrix. The floating junctions FJ11 to FJ14 are arranged between the gate control lines TG1 and TG2 at each column respectively. In this drawing, a gate pair driven by the gate control lines TG1 and TG2, for example, TG11 and TG21 shown in FIG. 2 are omitted.

Further, the drive transistor D11 and address transistor AD11 forming the output circuit are arranged at each column between the second photo diode row of PD21 to PD24 and the third photo diode row of PD31 to PD34. An address line ADD1 and a reset drain voltage line RD are extended in the row direction between the second photo diode row of PD21 to PD24 and the third photo diode row of PD31 to PD34.

Next, between the floating junctions FJ11' to FJ14' are arranged between and in parallel with the gate control lines TG3 and TG4 with each of the floating junctions positioned in a column.

Furthermore, the RS transistor RS11 forming the output circuit is arranged between the fourth photo diode row of PD41 to PD44 and the fifth photo diode row of PD51 to PD54, with each of the RS transistor positioned in a column. In FIG. 3, such configuration is repeated in the column direction.

In summary, In summary, in the CMOS image sensor according to the embodiment of the present invention, three different kinds of units, which are a reading unit composed of two reading gates and one floating junction (a first unit), an amplifier unit composed of an address transistor and a drive transistor (a second unit) and a reset unit composed of a reset transistor (a third unit) are sequentially and repeatedly arranged in the columns between the successive pixels of the two-dimensional matrix of the plurality of photo diodes.

Here, the gate electrodes of the address transistor (for example, AD11) and reset transistor (for example, RS11) may be directly extended from the address line (for example ADD1) or reset line (for example, RS11).

The widths of the three different kinds of units, that is, reading portion, amplifier portion and reset portion in the row direction can be formed almost equal to each other and can be made smaller than the sum of the length of the photo diode pixels and a width of isolation area in the horizontal direction respectively.

Further, in this embodiment, the isolation area between the photo diodes arranged in the horizontal direction may be an impurity diffusion area formed by ion implantation instead of the isolation by a thick oxide film, which is conventionally used widely. With respect to the gap areas between any adjacent photo diodes arranged in the vertical direction, the isolation with the thick oxide film may be used for the gap areas where the gate electrodes of the address transistor (for example, AD1) and reset transistor (for example, RS11) forming the output circuit. However, the isolation with the impurity diffusion may be used for the gap area s, where the reading unit is arranged may be formed by an impurity diffusion area formed by the ion implantation.

Figure 6A:
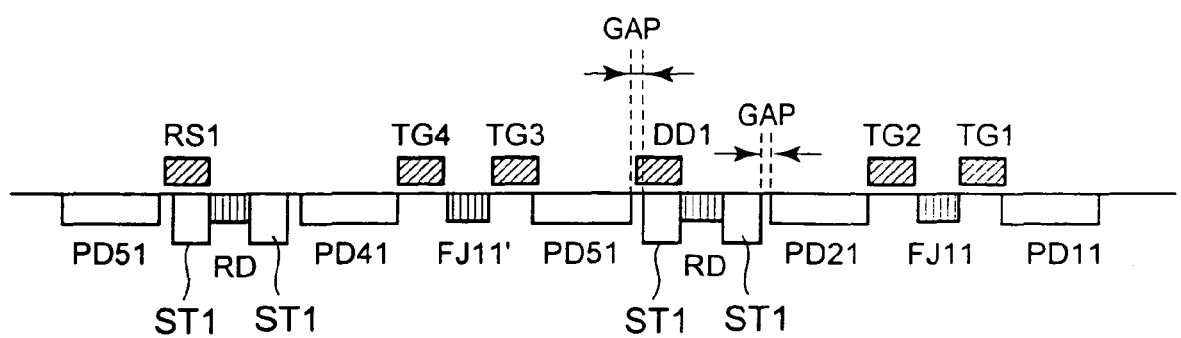
FIG. 6(A) is a cross sectional view of a wiring pattern cut off along the chain line A-A' shown in FIG. 3.
Figure 6B:
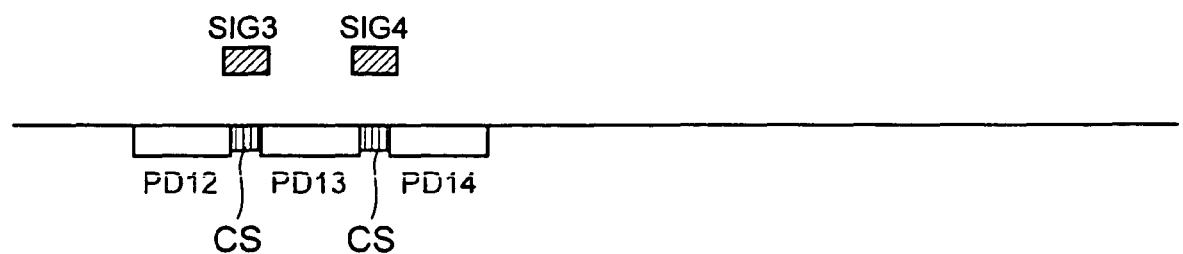
FIG. 6(B) is a cross sectional view of the wiring pattern cut off along the chain line B-B' shown in FIG. 3.

FIG. 6 is a diagram showing isolation areas between the photo diodes, wherein FIG. 6(A) is a cross sectional view of a wiring pattern cut off along the chain line A-A' shown in FIG. 3, and FIG. 6(B) is a cross sectional view of the wiring pattern cut off along the chain line B-B' shown in FIG. 3. In these drawings, the same numerals are assigned to the components corresponding to the components shown in FIG. 3.

In FIG. 6(A), in the gap area between the photo diodes PD21 and PD31, there is the drain area RD of the address transistor of the output circuit. Then there are device separation areas STIs between the drain area RD and the photo diode PD21 and between the drain area RD and the photo diode PD31. The word STI is an abbreviation for "Shallow Trench Isolation", which is a device isolation structure where a trench-shaped hole is made in a semiconductor substrate and is berried by an insulator such as a silicone oxide film. As a general device isolation method for the semiconductor devices, the isolation using selective oxidation is well known. However, as devices become finer, a reduction in the width of the isolation area is required. In such a case, device isolation with the STI method is generally used. In the drawing, the address gate line ADD1 and the reset line RS1 are used as transistor gates and are applied with high potential. Therefore, if the isolation area between the drain area and the photo diodes is formed by a thin oxide film, a channel is formed in the isolation area, when high potential is applied. Thus, the signal charge accumulated in the photo diodes leaks into the drain area kept at high potential, and an amount of saturation charge is reduced. Therefore, between the output circuit and the photo diodes, the isolation area using the thick oxide film is necessary. When the isolation area is formed by a thick oxide film, an advantage is obtained that the electrostatic capacity between the address gate, reset gate, and substrate is reduced and the high-speed driving margin is increased. However, to form a thick oxide film, a process of boring a hole in the substrate is required, which causes processing strain in the semiconductor substrate. In a device requiring dynamic driving such as an image sensor, the processing strain causes great deterioration to the image quality. To avoid the problem, a gap is usually formed between the STI end and the photo diodes. Then, impurities of an opposite conductivity type to that of the photo diodes are injected, there by preventing a depletion layer from extending from the photo diodes into the processing strain area of the STI.

Further, in the drawing, the gate lines TG1 and TG2 or TG3 and TG 4 for forming a reading gate are provided on both sides of the floating junction FJ11 or FJ11' in the gap area between the photo diodes PD11 and PD21 or the gap area between the photo diodes PD31 and PD41. The gate lines TG1 to TG4 are reading units and are formed on the semiconductor substrate via the thin oxide film. Thus, the isolation area at this part may be formed, for example, by an impurity diffusion area formed by ion implantation.

On the other hand, as shown in FIG. 6(B), no output circuit is provided between the photo diodes in the horizontal direction, for example, in the gap area between the photo diodes PD12 and PD13 or the photo diodes PD13 and PD14. Therefore, the isolation between the photo diodes arranged in the horizontal direction does not require any thick oxide film, instead it is desirable to form the isolation area (CS) by implanting the impurities of an opposite conduction type to the photo diodes using the ion implantation method. The reason is that the potential well of the photo diodes is lower than the drain voltage of the output circuit and that there is no gate electrode in the isolation area, but only the signal lines (SIG3, SIG4) are formed in the area separated by a thick insulating film. In the impurities area formed by the ion implantation method, the damage due to ion implantation can be eliminated easily by thermal annealing. Therefore, the impurities area can be formed in the neighborhood of the photo diodes and the gap area necessary for the STI structure is not required. Therefore, the width of the conventional isolation area of about 0.6 μm can be reduced to a half, that is, about 0.3 μm, so that the density of the integration in the horizontal direction can be increased, which is effective for the high integration of the whole sensor.

Here, the operation of the embodiment is substantially same as that of the embodiment shown in FIG. 1, so that the explanation thereof will be omitted.

Further, in the above explanation, the embodiment has a structure of 4 pixels for 1 cell. However, structures of 2 pixels for 1 cell, 6 pixels for 1 cell or 8 pixels for 1 cell can be realized according to the present invention.

Figure 4:
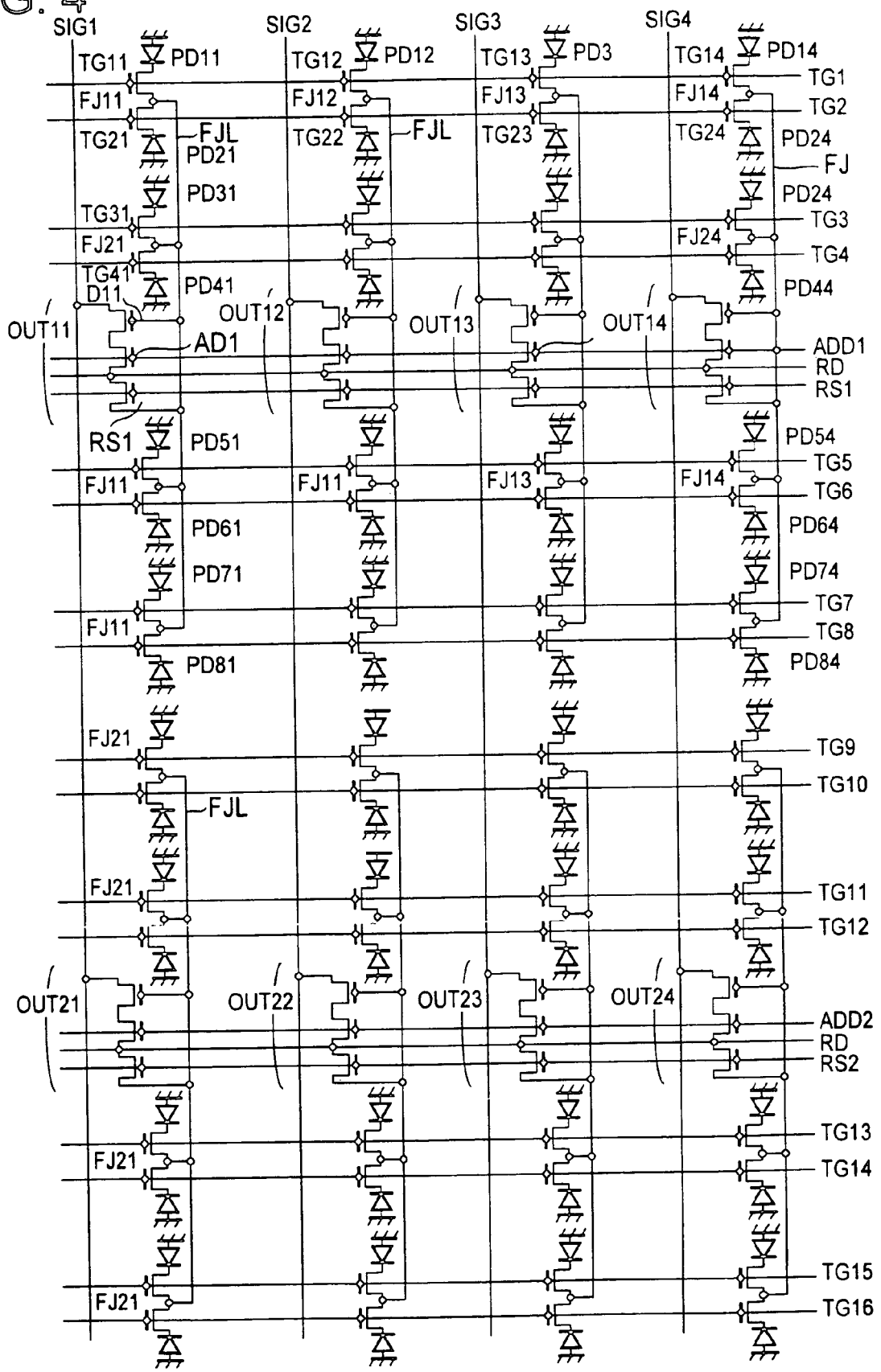
FIG. 4 is a circuit block diagram for showing other embodiment of the present invention.

In FIG. 4, an embodiment of a CMOS image sensor having a structure of 8 pixels for 1 cell is shown. In this embodiment, the same numerals are assigned to the components corresponding to the components shown in FIG. 1. Also in this embodiment, a plurality of photo diodes PD11, PD12, PD13, PD14, PD21, PD220, PD23, and PD24 are provided, which are arranged in a two-dimensional matrix having a predetermined repetitive pitches Ph and Pv in the row (horizontal) and column (vertical) direction. Among the plurality of photo diodes arranged in this manner, a plurality of output circuits OUT11 to OUT 14, and OUT21 to OUT24 are arranged in the gap areas between adjacent two pixels arranged in the column (vertical) direction. These output circuits are also arranged in a two-dimensional matrix having a horizontal pitch of Ph similar to the photo diodes, but having a vertical pitch of 8 times as long as the pitch Pv of the photo diodes, that is. 8Pv. The output circuits thus arranged read signal charge accumulated in the eight photo diodes arranged in the column. The output circuits OUT11 to OUT14 and OUT21 to OUT24 are so arranged that each output circuit is provided for the eight photo diodes successively arranged in the column. Namely, the output circuits OUT11 to OUT14 are arranged between the photo diodes arranged in the fourth and fifth rows, in the two-dimensional matrix of photo diodes. Further, the output circuits OUT21 to OUT24 are arranged between the photo diodes arranged in the 12th and 13th rows.

The output circuits OUT11 to OUT14 and OUT21 to OUT24 read the signal charge accumulated in the eight photo diodes successively arranged in the column. The reading operation is the same as that shown in FIG. 1, so that the explanation thereof will be omitted.

Figure 5:
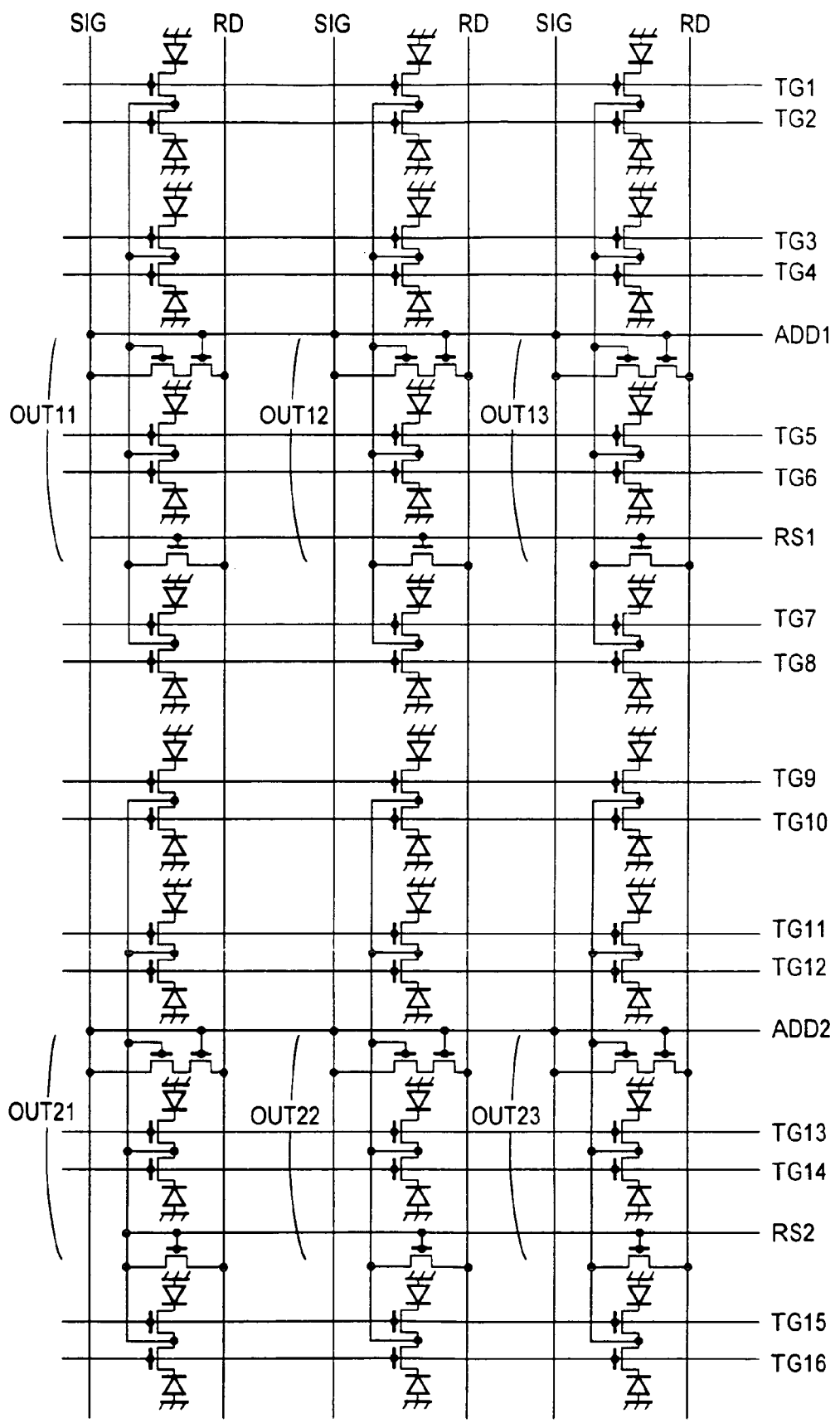
FIG. 5 is a circuit block diagram for showing still other embodiment of the present invention.

In FIG. 5, another embodiment of the CMOS image sensor having a structure of 8 pixels for 1 cell is shown. In this embodiment, the circuit structure is substantially same as the circuit structure of the output circuits OUT11 to OUT14, and OUT21 to OUT24 of the CMOS image sensor shown in FIG. 4 except for the arrangement of the circuit element. Therefore, the same numerals are assigned to the corresponding components to those shown in FIG. 4 and detailed explanation will be omitted. Since the circuit configuration of the output circuits OUT11 to OUT14 and OUT21 to OUT24 in this embodiment is substantially same as that shown in FIG. 2, the same numerals are assigned to the corresponding components and detailed explanation will be omitted similarly.

In this embodiment, each of the output circuits OUT11 to OUT13, and OUT21 to OUT23 is arranged for the eight photo diodes successively arranged in the same column. Namely, the output circuits OUT11 to OUT14 are arranged between the photo diodes arranged in the fourth and fifth rows in a two-dimensional matrix of photo diodes. Further, the output circuits OUT21 to OUT24 are arranged between the photo diodes arranged in the 12th and 13th rows.

Further, the drive transistor gate D11 and address transistor AD11 forming the output circuit and the RS transistor RS11 also forming the output circuit are arranged separately in two different rows among the two-dimensional matrix of pixels. Namely, the drive transistors forming the output circuits are arranged in two rows different from the rows where the reading gate pair TG11 and TG21 and the reading gate pair TG31 and TG41 are arranged in the two-dimensional matrix. Therefore, in this embodiment, the reading gate pair and the drive transistors forming the output circuit are alternately arranged in the rows in the two-dimensional matrix.

The reading operation is substantially same as that of the embodiment shown in FIG. 2, so that the explanation thereof will be omitted.

In the embodiments shown in FIGS. 2 and 5, with respect to adjacent two reset drain lines RD extending in the horizontal direction, it is possible to remove one and share the other one although the reset drain line RD is formed in each column. For example, it is possible to connect commonly the drain lines of the reset transistors RS11 and RS12 of the output circuits OUT11 and OUT12 shown in FIG. 2 to one of the reset drain lines RD to share one reset drain line RD by the two reset transistors RS11 and RS12. In this case, it is possible to similarly connect the drain lines of the address transistors AD11 and AD12 of the output circuits OUT11 and OUT12 to one of the reset drain lines (RD), thereby sharing one reset drain line RD by the two address transistors AD11 and AD12. In this case, for example, the address transistors AD11 and AD12 and drive transistors D11 and D12 of the output circuits OUT11 and OUT12 shown in FIG. 2 are arranged mutually in the line symmetrical positions (mirror inversion) about the shared drain line (RD) (not drawn).

In the embodiment shown in FIG. 1 or 4, the output circuits are inserted between the pair of pixels (photo diodes) located at every several rows among pixels arranged in the vertical direction, so that the pitch of the pixels in the vertical direction is not always same. The irregularity of the pixel arrangement can be corrected by slightly shifting positions of microlenses generally used to improve the focusing rate of each pixel and by shifting the focusing position to the opening corresponding to the photo diode forming each pixel. Further, it is possible to form an inner layer lens for changing the optical path between the micro-lens and the photo diode of the pixel, thereby further correcting the irregularity.

Figure 7:
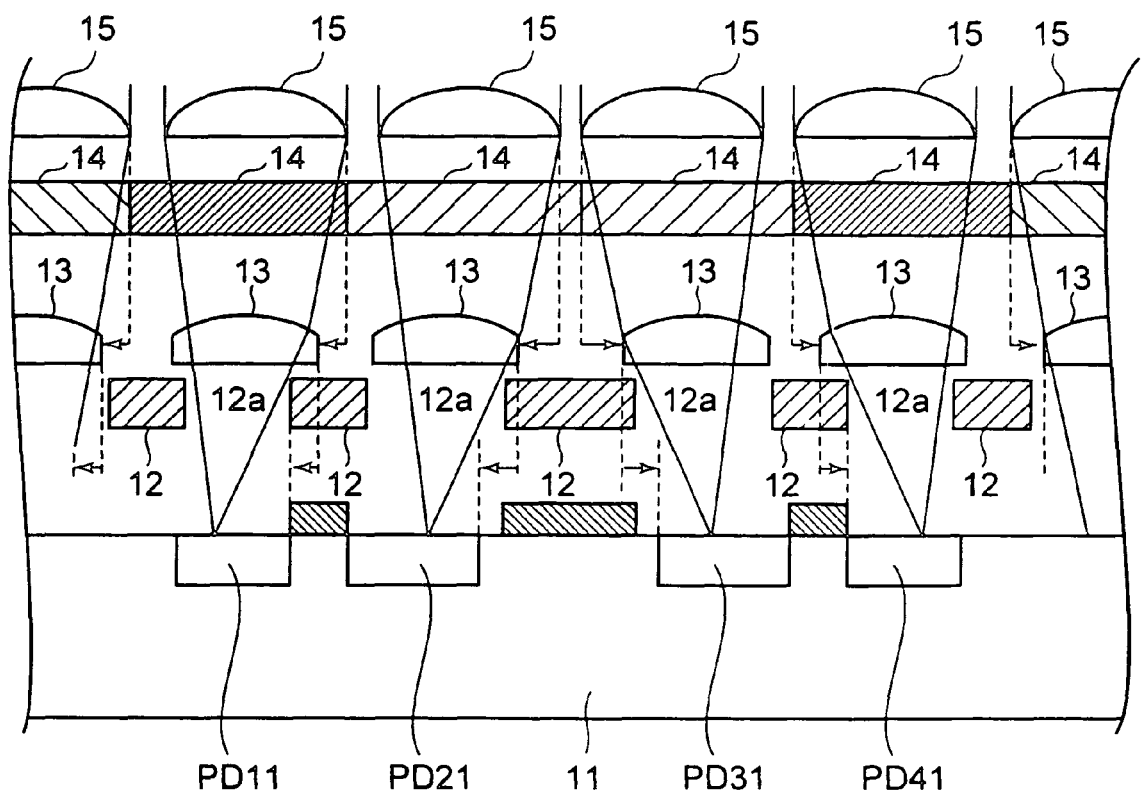
FIG. 7 is a partial cross sectional view showing an image sensor using a micro-lens and an inner layer lens for correcting the irregularity of the pixel arrangement.

FIG. 7 is a partial cross sectional view showing an image sensor using a micro-lens and an inner layer lens for correcting the irregularity of the pixel arrangement. The drawing is, for example, a cross sectional view of the part including the output circuit OUT11 shown in FIG. 1 and the photo diodes PD11, PD21, PD31, and PD41 arranged on both sides of the output circuit OUT11 in the row (vertical) direction. On the surface of the semiconductor substrate 11, the photo diodes PD11, PD21, PD31, and PD41 corresponding to the pixels are formed and above them, light shielding film layers 12 forming openings 12a for entering light to the photo diodes are installed. Above the light shielding film layers 12, inner layer lenses 13 are formed at the positions corresponding to the openings 12a of the light shielding film layers 12. The inner layer lenses 13 are formed, for example, by a nitride film having a refractive index larger than that of a resist member. Above the inner layer lenses 13, color filter layers 14 are formed. The color filter layers 14 are, for example, filters for selecting the wave length of transmitting light such as red, green, or blue for each pixel. On the tops of the color filter layers 14, micro-lenses 15 corresponding to the pixels are arranged almost at equal intervals. The micro-lenses 15 are formed, for example, by acrylic resin.

In the image sensor formed in this way, the micro-lenses 15 corresponding to the pixels are arranged at almost equal intervals. On the other hand, although the inner layer lenses 13 are arranged on the photo diodes at almost equal intervals, they are arranged at narrow intervals on the output circuit OUT13. Thus, the optical path of a light focused by the micro-lenses 15 is changed by the inner layer lenses 13 and is led to the openings 12a formed in the light shielding film layers 12. The irregularity of the pixel arrangement can be thus corrected.

In the embodiments according to the present invention, the components in the horizontal direction are the photo diodes and the isolation area, and the lines are laid on the isolation area, which may be metallic lines, which are used to shield light. Here, the metallic lines are, for example, RD power source lines, which may serve as a light shielding film.

Further, with respect to the pitch in the vertical direction, as described above, each pixel gap area is composed of any of the reading unit composed of two reading gates and one floating junction, the amplifier unit composed of an address transistor and a drive transistor, and the reset unit composed of a reset transistor and the portions are almost equal in width. Effective use of the gap areas between the pixels in the column (vertical) direction can improve high integration. Particularly, it is necessary to arrange a plurality of pixels in a square matrix in application of the image sensor to a digital camera and a portable telephone with a camera. Therefore, the pixel openings are required to be arranged at equal intervals as far as possible. From the viewpoint, the high integration according to the embodiments of the present invention is advantageous in the design of the layout of the pixel cells.

Furthermore, the openings can be made wide in the horizontal direction to form a horizontally long rectangular, since there is no output circuits formed in the horizontal direction. With the configuration, a sensor can be realized, which is hardly affected by shading compared with the vertically long pixel openings of the CMOS area sensor or CCD area sensor. Further, the method for forming isolation area by ion implantation in the embodiment according to the present invention can suppress an occurrence of crystalline defects in the semiconductor and can suppress faults due to a junction leak, as proved by the CCD area sensor, compared with the isolation using the thick oxide film. Thus, improvement in quality of an image can be expected.

In the embodiment of the present invention shown in FIG. 2, two reading gate lines (for example, TG1, TG2), one RS line (RS) or one address line (ADD) are respectively provided extending in the horizontal direction between the pixels arranged in the column (vertical) direction. For example, the source portions of the pair of the reading gates TG1 and TG2 are connected to the photo diodes PD11 and PD21, and the drain portions thereof are shared with FJ11, so that there is no need to extend the pixel intervals in the column (vertical) direction, even if the two gate lines are provided. On the other hand, for the RS transistor RS11, the source portion is a diffusion layer portion (not drawn) connected to the floating junctions FJ11 and FJ11', and the drain portion (not drawn) is connected to the RD line (RD), which are necessary to form between the pixels. Thus, only one line maybe provided, so that similarly there is no need to extend the pixel intervals in the column (vertical) direction. Similarly, when forming the address transistor AD11 and the drive transistor D11 between the photo diode PD21 and PD31, only the address line may be provided, so that similarly there is no need to extend the pixel intervals in the column (vertical) direction.

In the embodiment of the present invention described above, the example of the output circuit composed of three transistors such as the drive transistor, address transistor, and reset transistor is explained. However, an output circuit omitting an address transistor by changing the reset drain potential may be used in the embodiments of the present invention. The output circuit is disclosed, for example, in "Video Information Media Society Technology Report, Vol. 28, No. 23, P. 35 to 38, March, 2004".

What is claimed is

1. A CMOS image sensor comprising:
a plurality of photoelectric conversion elements arranged in a matrix having a plurality of rows and columns;
a plurality of floating junctions, each of which is arranged between two adjacent rows of a plurality of the photoelectric conversion elements arranged in the same columns, and is connected to a pair of the photoelectric conversion elements arranged in the adjacent rows and in the same columns so that output signals of the pair of photoelectric conversion elements may be transferred;
output circuits connected to the plurality of floating junctions arranged in the same columns to commonly read the output signals of the photoelectric conversion elements transferred to the floating junctions; and
output signal lines provided for each column so as to supply output signals of the output circuits, wherein
the output circuits are arranged between the pairs of photoelectric conversion elements which are arranged in the same columns, and
the plurality of the photoelectric conversion elements arranged in the same row are respectively connected to the floating junctions via reading gate transistors, which are driven by a same control gate line and at least one gate of a transistor element in the output circuits is directly connected to the plurality of floating junctions.

2. The CMOS image sensor according to claim 1, wherein the plurality of pairs of the photoelectric conversion elements are respectively connected to the plurality of floating junctions via transfer gate transistors, and
the output circuits comprise a drive transistor and an address transistor, which are connected in series between the output signal lines and a reset drain portion, and a reset transistor connected between the floating junctions and the reset drain portion, wherein a set of the drive transistor, the address transistor, and the reset transistor are located separately in a plurality of gap areas between the pair of photoelectric conversion elements arranged adjacent to each other in a column direction.

3. The CMOS image sensor according to claim 2, wherein the transfer gate transistors are controlled in transfer by a gate line extending in a row direction.

4. The CMOS image sensor according to claim 2, wherein in a neighborhood of the drive transistor and the address transistor, an address line is formed in the row direction and in a neighborhood of the reset transistor, a reset line is formed in the row direction.

5. The CMOS image sensor according to claim 4, wherein the reset transistor is connected to one of a plurality of reset drain voltage lines provided for each row or column and the drive transistor is connected to one of a plurality of signal output lines provided for each column.

6. The CMOS image sensor according to claim 5, wherein a gate electrode of the reset transistor is connected to one of a plurality of reset lines provided for each row and a gate electrode of the address transistor is connected to one of a plurality of address lines provided for each row.

7. The CMOS image sensor according to claim 6, wherein the address transistor and the drive transistor are connected in series between one of the plurality of reset drain voltage lines and one of the plurality of signal output lines.

8. The CMOS image sensor according to claim 1, wherein the plurality of photoelectric conversion elements are photo diodes.

9. The CMOS image sensor according to claim 8, wherein each of the output circuits is shared in reading signal charge accumulated in the plurality of photo diodes arranged in the same column.

10. The CMOS image sensor according to claim 9, wherein a row isolation area between the photo diodes arranged in a row direction is an impurity diffusion area formed by ion implantation.

11. The CMOS image sensor according to claim 10, wherein a column isolation area between the photo diodes arranged in the same column, where the floating junctions are formed is an impurity diffusion area formed by ion implantation.

12. The CMOS image sensor according to claim 1, wherein the plurality of pairs of the photoelectric conversion elements are respectively connected to the plurality of floating junctions via transfer gate transistors, and
the output circuits comprise a drive transistor and an address transistor, which are connected in series between the output signal lines and a reset drain portion, and a reset transistor connected between the floating junctions and the reset drain portion.

13. The CMOS image sensor according to claim 12, wherein the transfer gate transistors are controlled in transfer by a gate line extending in a row direction.

14. The CMOS image sensor according to claim 12, wherein in a neighborhood of the drive transistor and the address transistor, an address line is formed in the row direction and in a neighborhood of the reset transistor, a reset line is formed in the row direction.

15. The CMOS image sensor according to claim 14, wherein the reset transistor is connected to one of a plurality of reset drain voltage lines provided for each row or column and the drive transistor is connected to one of a plurality of signal output lines provided for each column.

16. The CMOS image sensor according to claim 15, wherein a gate electrode of the reset transistor is connected to one of a plurality of reset lines provided for each row and a gate electrode of the address transistor is connected to one of a plurality of address lines provided for each row.

17. The CMOS image sensor according to claim 16, wherein the address transistor and the drive transistor are connected in series between one of the plurality of reset drain voltage lines and one of the plurality of signal output lines.

18. The CMOS image sensor according to claim 17, wherein irregularity of pixel arrangement due to the output circuits provided between adjacent photo diodes arranged in the same column is corrected by a micro-lens.

19. The CMOS image sensor according to claim 18, wherein the irregularity of the pixel arrangement is corrected by the micro-lens and an inner layer lens.

20. The CMOS image sensor according to claim 1, wherein
each of the plurality of floating junctions are arranged between a first adjacent pair of the photoelectric conversion elements arranged in the same column, and each of the plurality of floating junctions is connected to at least one of the first adjacent pair of the photoelectric conversion elements,
gate control lines are provided on both sides of the floating junctions extending along the rows, and
at least one element included in the output circuits is arranged between another two adjacent pairs of the photoelectric conversion elements arranged in the same column as the first adjacent pair of the photoelectric conversion elements is arranged.

* * * * *